(12) United States Patent
Park

(10) Patent No.: US 8,915,213 B2
(45) Date of Patent: Dec. 23, 2014

(54) DIVISION MASK AND METHOD OF ASSEMBLING MASK FRAME ASSEMBLY BY USING THE SAME

(75) Inventor: Kook-Chul Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 43 days.

(21) Appl. No.: 13/237,383

(22) Filed: Sep. 20, 2011

(65) Prior Publication Data

US 2012/0174863 A1 Jul. 12, 2012

(30) Foreign Application Priority Data

Jan. 10, 2011 (KR) ........................ 10-2011-0002305

(51) Int. Cl.
| | | |
|---|---|---|
| *B05C 11/00* | (2006.01) | |
| *H01L 51/56* | (2006.01) | |
| *C23C 14/04* | (2006.01) | |
| *C23C 14/12* | (2006.01) | |
| *B05C 21/00* | (2006.01) | |
| *H01L 51/00* | (2006.01) | |
| *C23C 16/04* | (2006.01) | |
| *H01L 51/50* | (2006.01) | |
| *B05B 15/04* | (2006.01) | |

(52) U.S. Cl.
CPC ............. *C23C 14/12* (2013.01); *H01L 51/0011* (2013.01); *C23C 16/042* (2013.01); *H01L 51/50* (2013.01); *C23C 14/042* (2013.01); *B05B 15/045* (2013.01); *B05C 21/005* (2013.01)
USPC ........... 118/504; 118/505; 118/720; 118/721; 427/282; 29/428

(58) Field of Classification Search
CPC .. C23C 14/042; C23C 16/042; B05C 21/005; H01L 51/0011
USPC .................. 118/720, 721, 503–505; 427/282; 29/428
See application file for complete search history.

(56) References Cited

U.S. PATENT DOCUMENTS

| | | | | |
|---|---|---|---|---|
| 6,501,214 | B1 * | 12/2002 | Sakamoto et al. ............ | 313/407 |
| 2001/0018309 | A1 * | 8/2001 | Nishiki et al. .................. | 445/30 |
| 2004/0020435 | A1 * | 2/2004 | Tsuchiya et al. ........ | 118/723 VE |
| 2007/0017895 | A1 * | 1/2007 | Yotsuya et al. ................ | 216/41 |
| 2007/0163494 | A1 * | 7/2007 | Tokie et al. ................... | 118/301 |
| 2009/0137180 | A1 * | 5/2009 | Sung et al. ..................... | 445/60 |
| 2009/0297768 | A1 * | 12/2009 | Ko ................................. | 428/136 |
| 2010/0021829 | A1 * | 1/2010 | Kang et al. ........................ | 430/5 |

(Continued)

FOREIGN PATENT DOCUMENTS

| | | |
|---|---|---|
| KR | 10-0908232 | 7/2009 |
| KR | 10-2010-0090070 | 8/2010 |

*Primary Examiner* — Dah-Wei D Yuan
*Assistant Examiner* — Binu Thomas
(74) *Attorney, Agent, or Firm* — Robert E. Bushnell, Esq.

(57) ABSTRACT

In a division mask and a method of assembling a mask frame assembly by using the same, the division mask includes a stick body on which deposition patterns are formed, and a clamping portion which extends from the stick body outward along a longitudinal direction of the stick body, the clamping portion increasing in width from the stick body. By using this structure, since tight tension is exerted on the division mask during the assembly of a mask frame assembly due to an extension portion of the clamping portion, creases are prevented from being formed on the division mask, thus obtaining a precise mask frame assembly.

13 Claims, 6 Drawing Sheets

(56) References Cited

U.S. PATENT DOCUMENTS

| | | | |
|---|---|---|---|
| 2011/0139357 A1* | 6/2011 | Lee et al. | 156/494 |
| 2011/0168087 A1* | 7/2011 | Lee et al. | 118/504 |
| 2011/0220019 A1* | 9/2011 | Lee et al. | 118/504 |
| 2011/0229633 A1* | 9/2011 | Hong et al. | 118/504 |

* cited by examiner

DIVISION MASK AND METHOD OF ASSEMBLING MASK FRAME ASSEMBLY BY USING THE SAME

CLAIM OF PRIORITY

This application makes reference to, incorporates the same herein, and claims all benefits accruing under 35 U.S.C. §119 from an application earlier filed in the Korean Intellectual Property Office on the 10 of January 2011 and there duly assigned Serial No. 10-2011-0002305.

BACKGROUND OF THE INVENTION

1. Field of the Invention

The present invention relates to division masks used in depositing thin films and methods of assembling mask frame assemblies by using the division masks.

2. Description of the Related Art

In general, among display devices, organic light-emitting display devices have wide viewing angles, excellent contrast, and quick response speeds.

In an organic-light emitting display device, light is emitted by the recombination of holes and electrons which are injected into an anode and a cathode. The organic-light emitting display device has a stack structure in which the emissive layer is inserted between the anode and the cathode. However, since it is difficult for an organic-light emitting display device having this structure to have high luminescent efficiency, an electron injection layer, an electron transfer layer, a hole transfer layer, a hole injection layer and the like are selectively inserted between the emissive layer and each of the anode and the cathode.

Electrodes and intermediate layers, including an emissive layer of an organic-light emitting display device, are formed by using various methods. One of the methods is a deposition method. In order to manufacture an organic-light emitting display device by using the deposition method, a fine metal mask (FMM) having the same patterns as those of a thin film to be formed on a substrate is aligned on the substrate, and then the thin film having desired patterns is formed by depositing a raw material of the thin film.

As the FMM is large in size, more etching errors occur, and a central portion of the FMM is likely to sag due to its weight. Thus, recently, a division mask, formed by forming various mask sticks and attaching the mask sticks onto a frame, has been widely used.

However, the division mask is large in size, having a length of about 1,840 mm in order to satisfy the users' requirements of a large-size display device. Thus, creases may be formed lengthwise in each division mask. That is, as each division mask is long in size, creases may be formed on the division mask, and the division mask is not consistently flat. In this case, various problems may occur also in a deposition process in which fine patterns are to be formed by using the division mask.

Thus, there is a need to prevent creases from being formed on the division mask.

SUMMARY OF THE INVENTION

The present invention provides division masks used in depositing thin films, wherein the formation of creases in the division masks is prevented, and methods of assembling mask frame assemblies by using the division masks.

According to an aspect of the present invention, a division mask comprises: a stick body on which deposition patterns are formed; and a clamping portion which extends from the stick body outward along a longitudinal direction of the stick body, increasing in width from the stick body.

A connection portion between the stick body and the clamping portion may be welded on a frame of a mask frame assembly.

The clamping portion may be removed after the connection portion is welded on the frame.

The clamping portion may include an extension portion having a width which increases from the stick body outward, and which may have a 'Y' shape.

According to another aspect of the present invention, a method of assembling a mask frame assembly comprises: preparing a plurality of division masks, each including a stick body on which deposition patterns are formed and a clamping portion which extends from the stick body outward along a longitudinal direction of the stick body, increasing in width from the stick body, and a frame to which the plurality of division masks are attached; and welding the stick body on the frame while tension is exerted on the division mask by holding the clamping portion of the division mask.

The method may further include cutting the clamping portion of the division mask on which the welding is completed.

A connection portion between the stick body and the clamping portion may be welded on the frame when the stick body is welded on the frame.

The clamping portion may include an extension portion having a width which increases from the stick body outward, and which may have a 'Y' shape.

By using the above structure, since tight tension is exerted on the division mask during the assembly of a mask frame assembly due to an extension portion of the clamping portion, creases may be prevented from being formed, thus obtaining a precise and stable mask frame assembly.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
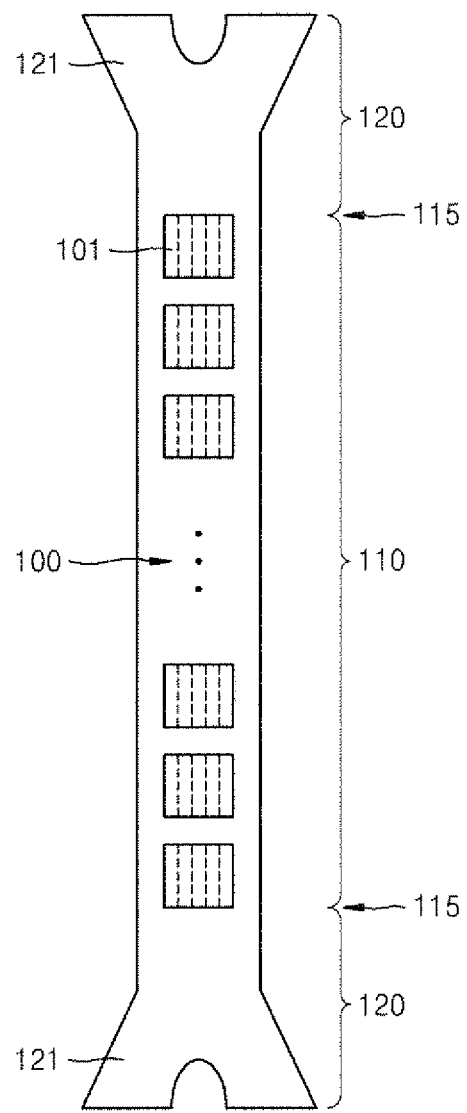
FIG. 1 is a plan view of a division mask according to an embodiment of the present invention.
Figure 2:
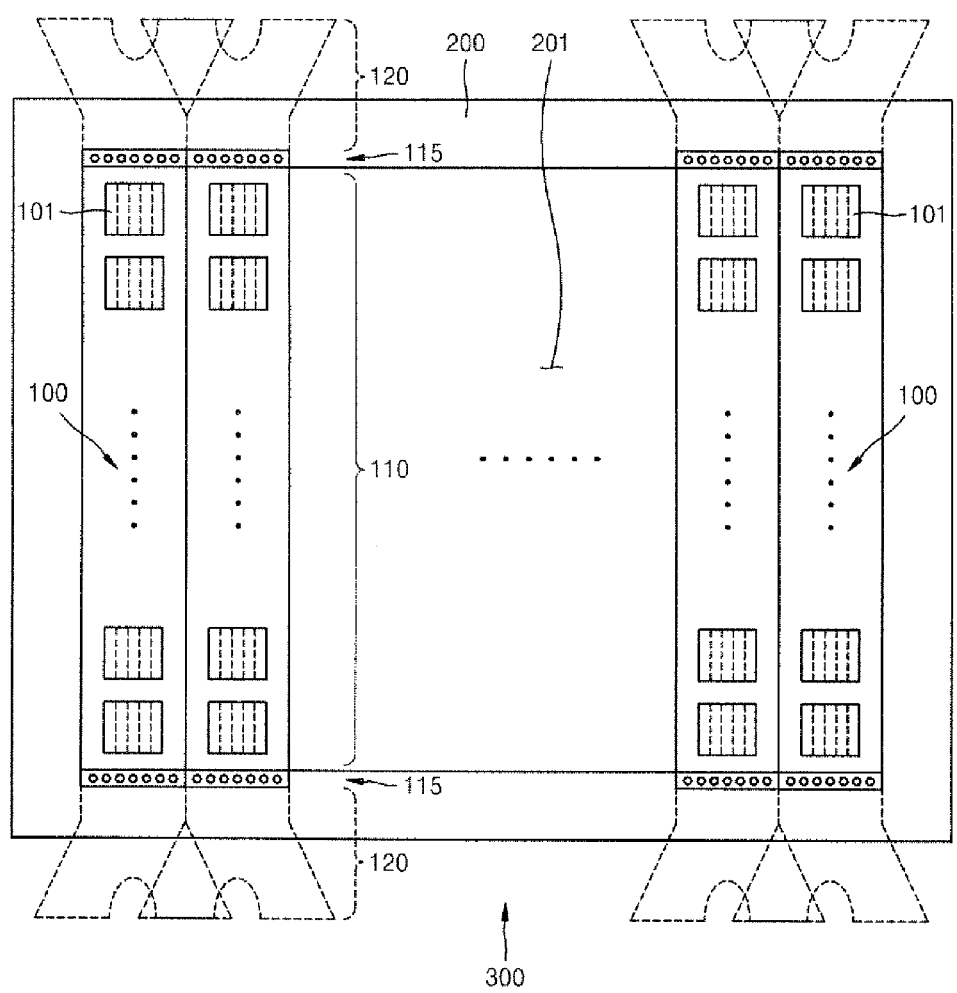
FIG. 2 is a plan view of a mask frame assembly in which the division mask of FIG. 1 and a frame are attached to each other according to an embodiment of the present invention.

FIG. 1 is a plan view of a division mask according to an embodiment of the present invention, and FIG. 2 is a plan view of a mask frame assembly in which the division mask of FIG. 1 and a frame are attached to each other according to an embodiment of the present invention.

A plurality of division masks 100 are welded on a frame 200 (see FIG. 2) to constitute a mask frame assembly 300. The division mask 100 may be formed of, for example, nickel, nickel alloy, nickel-cobalt alloy or the like.

As shown in FIG. 1, the division mask 100 includes a stick body 110 on which deposition patterns 101 are formed, and clamping portions 120 which are integrally formed with two opposite ends of the stick body 110.

The stick body 110 is welded on the frame 200 (see FIG. 2) so as to constitute the mask frame assembly 300 which is used in a deposition process. The clamping portions 120 are used to exert tension when the stick body 110 is welded onto the frame 200, and are removed during the assembly process. Reference numeral 115 indicates a boundary between the stick body 110 and the clamping portions 120, and is a connection portion which is to be welded onto the frame 200.

The division masks 100 are attached to the frame 200 so as to constitute the mask frame assembly 300 as shown in FIG. 2. The division mask 100 is fixed on the frame 200 by welding the connection portion 115 to the frame 200 so that the deposition patterns 101 are positioned in an opening 201 of the frame 200. The clamping portions 120 are removed after the connection portion 115 is welded onto the frame 200, as indicated by dotted lines in FIG. 2.

Each clamping portion 120 has a 'Y' shape and includes an extension portion 121 having a width which increases from the stick body 110 outward along a longitudinal direction of the stick body 110. Thus, the clamping portion 120, including the extension portion 121, has an advantageous structure for exerting tension when the division mask 100 is welded onto the frame 200.

That is, in order to weld the division mask 100 onto the frame 200, connection portions 115 are welded onto the frame 200 while the clamping portions 120, integrated with the two ends of the division mask 100, are being held and pulled by a tensioner (not shown). In this case, when the clamping portions 120, each including the extension portion 121, are held and pulled, since a contact area between the clamping portion 120 and the tensioner is greater than in a case without the extension portion 121, greater tension may be exerted on the division mask 100 as compared to the case without the extension portion 121. Thus, since welding is performed when very tight tension is exerted on the division mask 100, a surface flatness of the division mask 100 is increased so as to thereby remarkably reduce the sizes of creases.

FIGS. 3A thru 3D are plan views used to describe a method of assembling the mask frame assembly of FIG. 2 according to an embodiment of the present invention.

A method of assembling the mask frame assembly 300 by using the division mask 100 may be performed according to the sequence shown in FIGS. 3A thru 3D.

First, the division masks 100 and the frame 200 are prepared. The frame 200 is an outer frame of the mask frame assembly 300 and has a square structure in which the opening 201 is formed in a central portion of the square structure. The connection portions 115 of the division mask 100 are welded and fixed on two sides of the frame 200, respectively.

The division mask 100 is a member which is shaped like a long stick. The deposition patterns 101, positioned in the opening 201, are formed on each of the division masks 100. In addition, as described above, the connection portions 115 between the stick body 110 and the clamping portions 120 are welded on the frame 200.

Figure 3A:
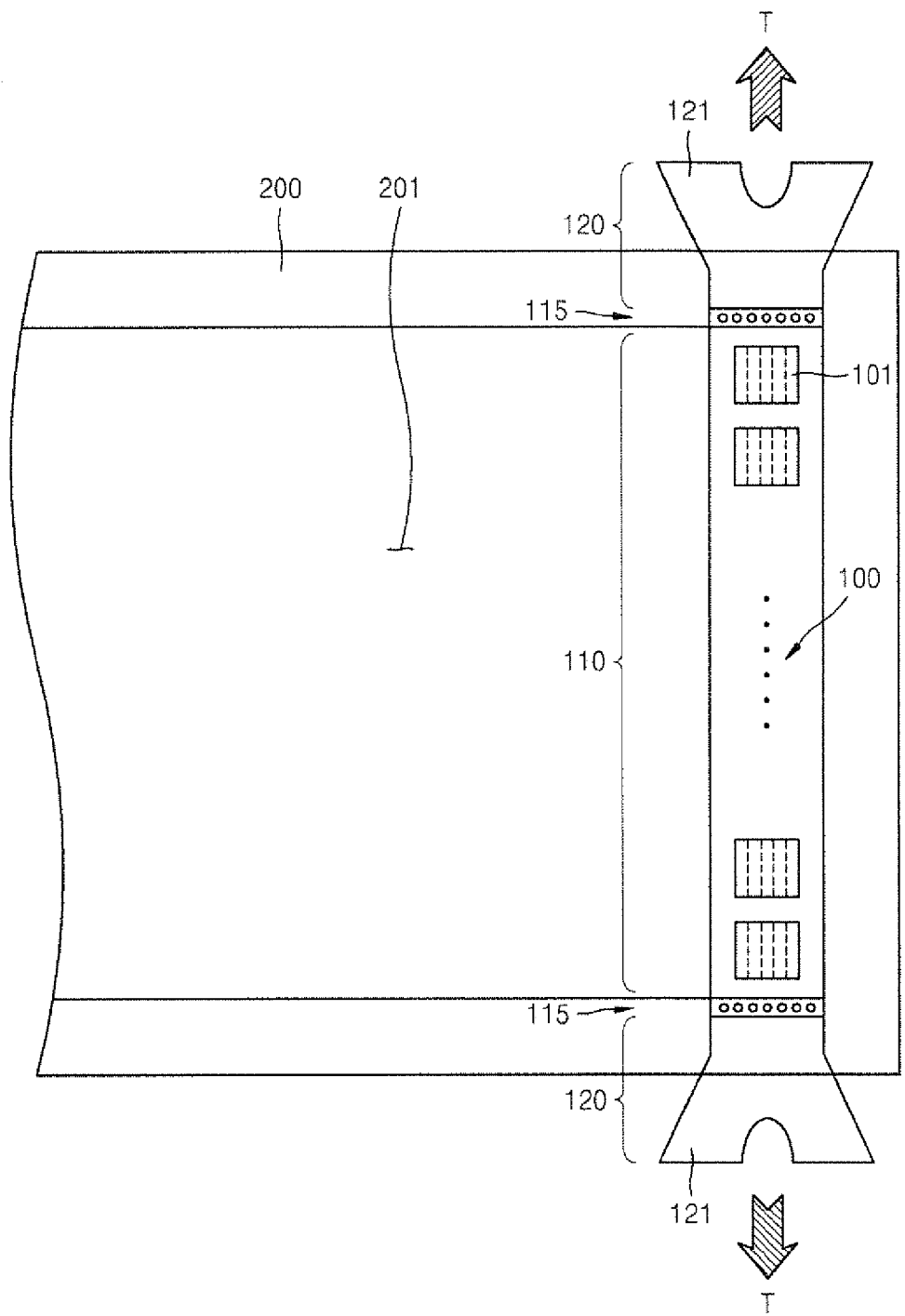
FIGS. 3A thru 3D are plan views used to describe a method of assembling the mask frame assembly of FIG. 2 according to an embodiment of the present invention.

FIG. 3A illustrates an operation in which a first division mask 100 is attached to the frame 200. Referring to FIG. 3A, the clamping portions 120, integrated with the two ends of the first division mask 100, are held and tightly pulled outward by a tensioner (not shown). Then, tight tension T is exerted on the division mask 100. As described above, since a contact area between the clamping portion 120 and the tensioner is increased due to the extension portion 121, more tension T is exerted on the division mask 100. Thus, the sizes of creases formed on the stick body 110 of the division mask 100 are remarkably reduced, thereby improving the surface flatness of the stick body 110. In this case, the first division mask 100 is fixed on the frame 200 by welding the connection portion 115 onto the frame 200.

Figure 3B:
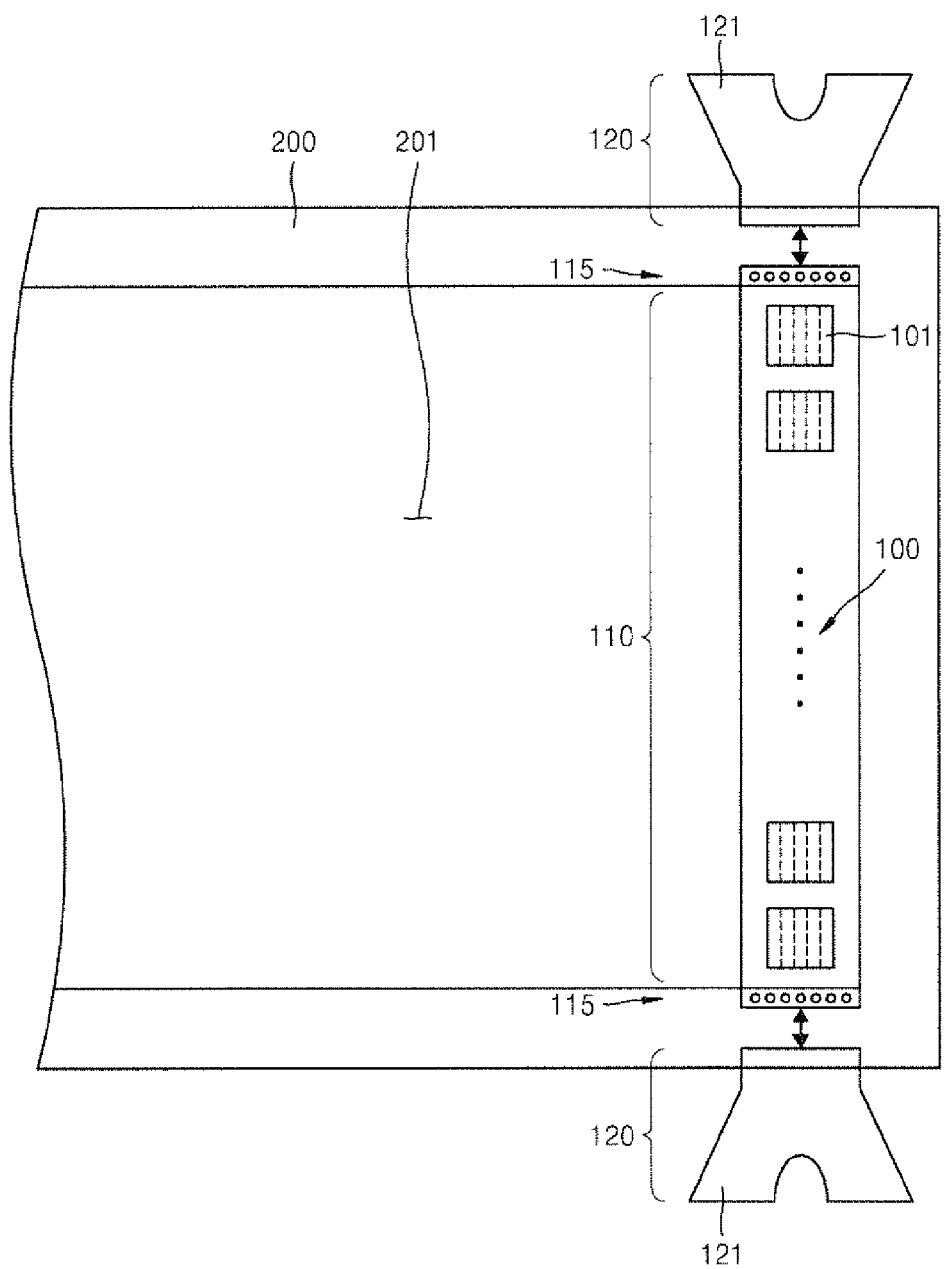

After the connection portions 115 are welded onto the frame 200, the clamping portions 120 formed outside the connection portions 115 are cut and removed, as shown in FIG. 3B. As described above, since the clamping portion 120 includes the extension portion 121 having a width which increases from the stick body 110 outward along a longitudinal direction of the stick body 110, the clamping portion 120 may interfere with another clamping portion 120 of another adjacent division mask 100 if the clamping portion 120 is maintained. Thus, prior to welding a second division mask 100, the clamping portions 120 of the first division mask 100 are cut and removed.

Figure 3C:
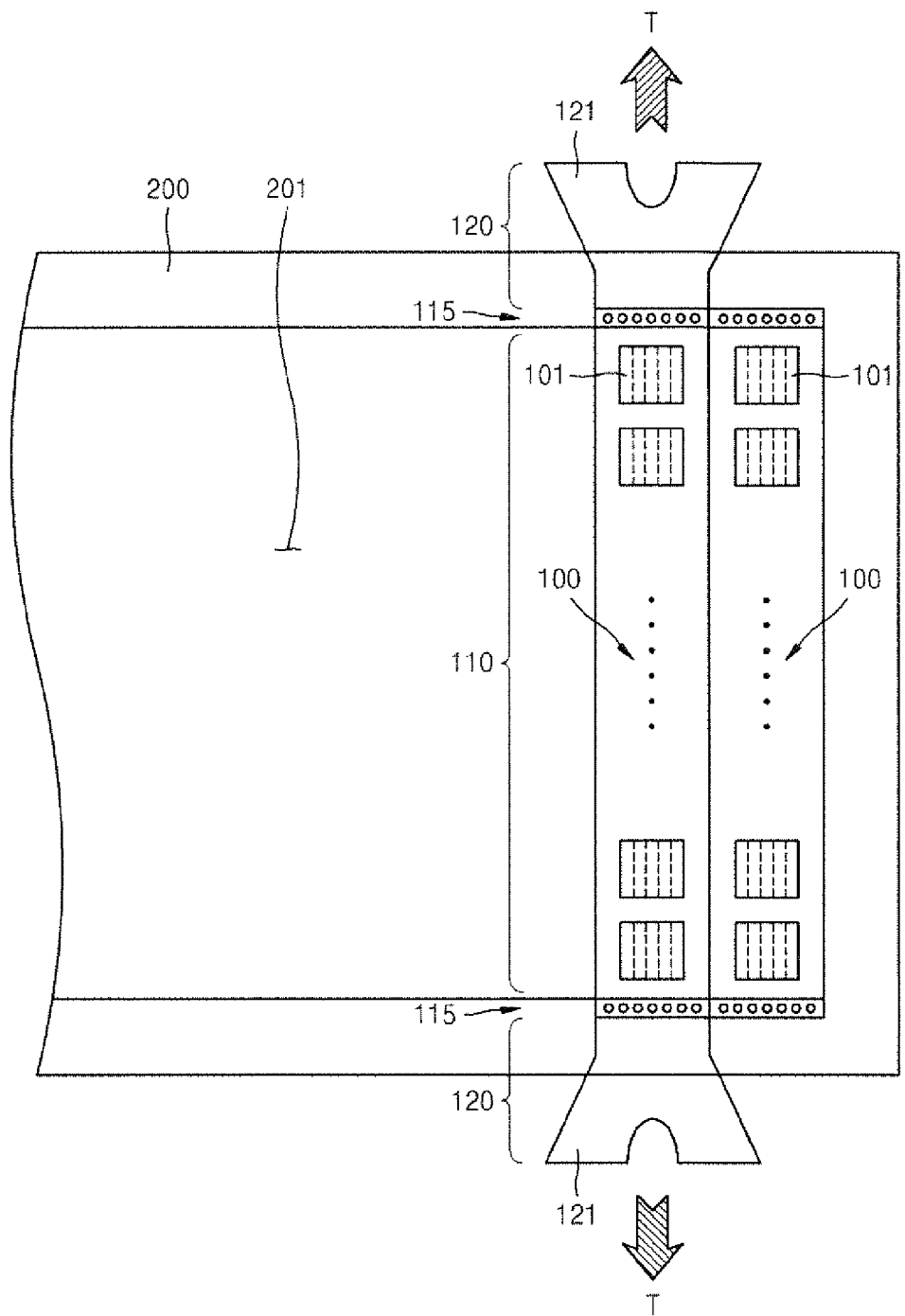

Likewise, after welding of the first division mask 100 is completed, the second division mask 100 is welded in the same manner as the first division mask 100, as shown in FIG. 3C. That is, tension T is exerted on the second division mask 100 by holding and pulling the Y-shaped clamping portion 120 of the second division mask 100. In this state, the connection portion 115 is welded onto the frame 200. Also, since a contact area between the clamping portion 120 and the tensioner is increased due to the extension portion 121, more tension T is exerted on the second division mask 100. Thus, the welding may be performed when the sizes of creases formed on the stick body 110 of the second division mask 100 are remarkably reduced.

Figure 3D:
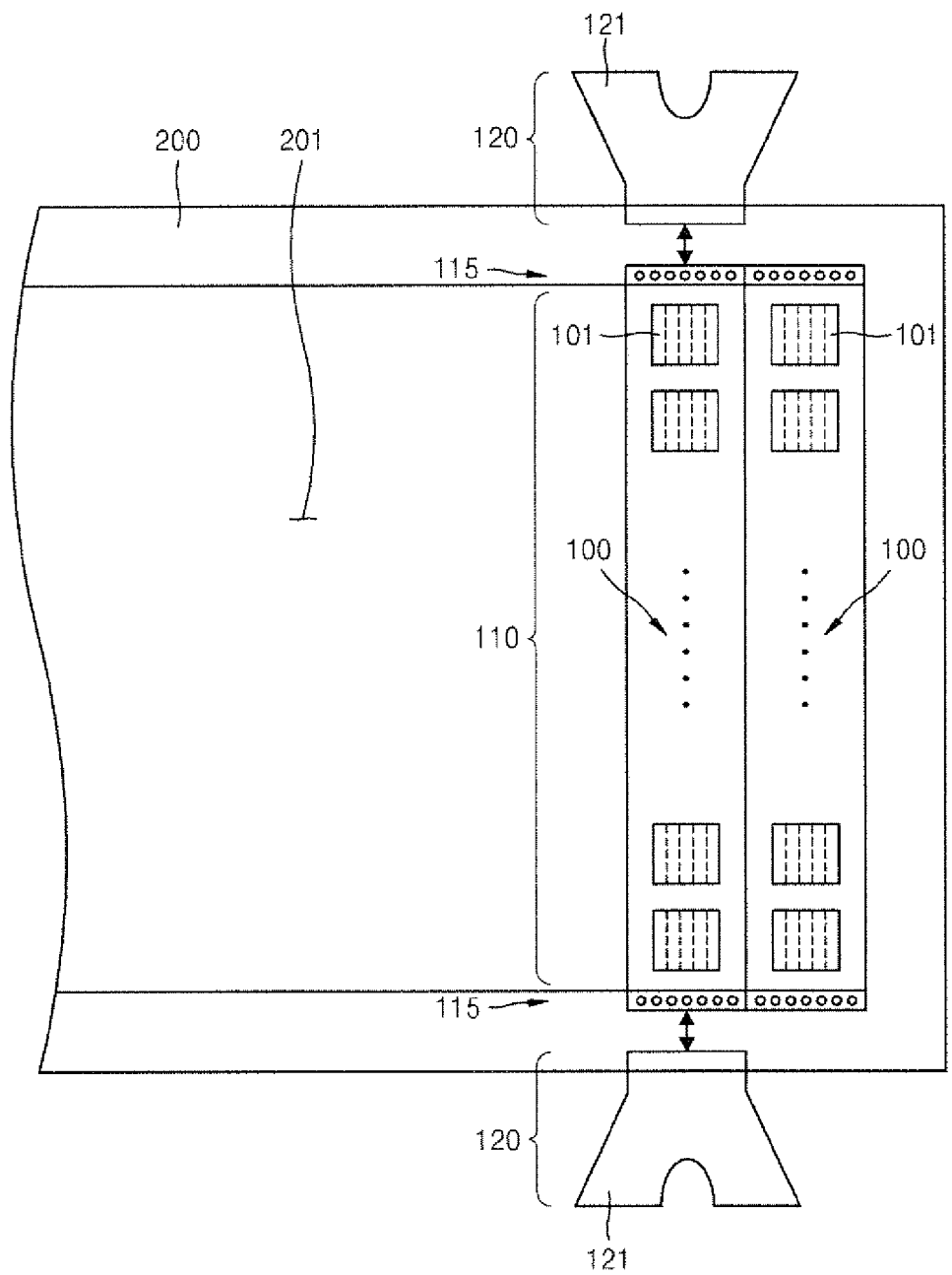

Also, as shown in FIG. 3D, after the connection portions 115 are welded onto the frame 200, the clamping portions 120 formed outside the connection portions 115 are cut and removed.

Likewise, the other division masks 100 are sequentially welded on the frame 200 so as to completely assemble the mask frame assembly 300, as shown in FIG. 2.

Accordingly, by using the division masks 100, since the division masks 100 are welded on the frame 200 during the assembly of the mask frame assembly 300 while very tight tension is being exerted on the division masks 100, creases may be prevented from being formed on the division masks 100, and thus, a precise mask frame assembly 300 may be obtained.

The sizes of creases formed on the division masks 100 were measured. As a result, a crease had a height of about 19.5 µm in the conventional case without the clamping portion 120 having a 'Y' shape. However, in the case of the clamping portion 120 having a 'Y' shape, a crease had a height of about 17.8 µm. Thus, about 8.7% of an improvement was obtained. Therefore, a precise and stable mask frame assembly 300 may be obtained.

In addition, the mask frame assembly 300 may be used in various deposition processes, including patterning processes of an organic light-emitting layer.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A division mask, comprising:
    a stick body on which deposition patterns are formed; and
    a pair of clamping portions extending from opposite ends of the stick body outward along a longitudinal direction of the stick body, each of the clamping portions comprise an extension portion having a width that increases from the stick body from a width equal to that of the stick body to a width that is greater than that of the stick body.

2. The division mask of claim 1, further comprising connection portions between the stick body and each of the clamping portions, each of the connection portions being welded onto a frame of a mask frame assembly.

3. The division mask of claim 2, wherein the clamping portions are removed after the connection portions are welded onto the frame.

4. A method of assembling of a mask frame assembly, comprising:
    preparing a plurality of division masks, each comprising a stick body on which deposition patterns are formed and a pair of clamping portions which extend from the stick body outward along a longitudinal direction of the stick body, wherein the clamping portions each comprise an extension portion having a width that increases from a width equal to that of the stick body to a width that is substantially larger than the width of the stick body;
    preparing a frame to which the plurality of division masks are attached; and
    welding the division masks onto the frame while tension is exerted on the division masks by holding the clamping portions of each of the division masks.

5. The method of claim 4, further comprising cutting the clamping portions of the division masks upon the welding being completed to prevent the clamping portions of one of the division masks from interfering with clamping portions of a neighboring one of the division masks.

6. The method of claim 4, wherein each clamping portion has a 'Y' shape.

7. The method of claim 4, wherein the welding of the division masks onto the frame comprises:
    welding a first of the plurality of division masks to the frame while a tensile force is being applied to the clamping portions; then
    cutting and removing the clamping portions of the first division mask upon the welding of the first division mask being completed; then
    welding a second of the plurality of division masks to the frame while a tensile force is being applied to the clamping portions, the second division mask being arranged adjacent to the first division mask on the frame; and then
    cutting and removing the clamping portions of the second division mask upon the welding of the second division mask being completed.

8. The method of claim 7, wherein a remaining of the division masks are sequentially welded to the mask frame.

9. The method of claim 4, wherein each of the division masks further comprises connection portions arranged between the stick body and each of the clamping portions, wherein the connection portions of each division mask are welded to the mask frame.

10. The method of claim 4, the clamping portions to allow for greater contact area between each division mask and a tensioner used to apply tension, so that each division mask can be subjected to a greater tensile force upon the welding of the division mask to the mask frame, resulting in a smaller crease height of the division mask.

11. The method of claim 7, wherein the stick body of the second division mask is in contact with the stick body of the first division mask, wherein the clamping portions of the first division mask are removed prior to the welding of the second division mask to prevent the clamping portions of the first division mask from interfering with the clamping portions of the second division mask.

12. A mask frame assembly, comprising:
    a mask frame arranged about an opening; and
    a plurality of division masks arranged in parallel and being welded to the frame, each division mask including a stick body including a plurality of deposition patterns arranged within the opening of the mask frame, wherein each division mask is welded to the mask frame while clamping portions on opposite ends of the stick body of each division mask are pulled outward with a tight tension, each of the clamping portions increasing in width with distance away from the stick body to a width greater than that of the stick body.

13. The mask frame assembly of claim 12, wherein the stick body of the each division mask is in contact with the stick body of each adjacent division mask, wherein the clamping portions of each division mask are removed to prevent interference with clamping portions of adjacent division masks.

* * * * *